United States Patent
Ahmed et al.

(10) Patent No.: US 9,640,231 B1
(45) Date of Patent: May 2, 2017

(54) SHARED SENSE AMPLIFIER

(71) Applicant: QUALCOMM Incorporated, San Diego, CA (US)

(72) Inventors: Fahad Ahmed, San Diego, CA (US); Chulmin Jung, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/014,830

(22) Filed: Feb. 3, 2016

(51) Int. Cl.
   *G11C 7/00* (2006.01)
   *G11C 7/06* (2006.01)
   *G11C 11/419* (2006.01)
   *G11C 11/412* (2006.01)

(52) U.S. Cl.
   CPC ............ *G11C 7/065* (2013.01); *G11C 11/412* (2013.01); *G11C 11/419* (2013.01)

(58) Field of Classification Search
   CPC ........... G11C 7/065; G11C 7/062; G11C 7/06; G11C 7/12; G11C 11/4091
   USPC ........................................ 365/205, 206, 207
   See application file for complete search history.

(56) References Cited

U.S. PATENT DOCUMENTS

| | | | |
|---|---|---|---|
| 3,594,590 A | 7/1971 | Smith | |
| 4,649,301 A | 3/1987 | Van Tran | |
| 5,854,562 A * | 12/1998 | Toyoshima | G11C 7/065 327/55 |
| 5,898,611 A * | 4/1999 | Yamada | G11C 11/419 365/154 |
| 6,759,898 B1 | 7/2004 | Opris | |
| 7,206,234 B2 * | 4/2007 | Pan | G11C 7/1084 327/77 |
| 7,719,357 B2 | 5/2010 | Wu | |
| 8,374,043 B2 * | 2/2013 | Lee | G11C 7/062 365/207 |
| 9,202,543 B2 * | 12/2015 | Boujamaa | G11C 7/14 |

FOREIGN PATENT DOCUMENTS

WO   2011145813 A   12/2011

* cited by examiner

*Primary Examiner* — Pho M Luu
(74) *Attorney, Agent, or Firm* — Arent Fox LLP

(57) ABSTRACT

A sense amplifier (SA) and a method for operating the SA are provided. The SA includes a first differential pair of transistors configured to receive a first differential input, a second differential pair of transistors configured to receive a second differential input, and a current source configured to source a current to flow through the first and second differential pairs of transistors. The method includes receiving by a first differential pair of transistors a first differential input, receiving by a second differential pair of transistors a second differential input, and flowing a current through the first and second differential pairs of transistors. A multi-bank memory is provided. The memory includes a first bank of memory cells and a second bank of memory cells sharing the disclosed SA.

28 Claims, 10 Drawing Sheets

US 9,640,231 B1

SHARED SENSE AMPLIFIER

BACKGROUND

Field

The present disclosure relates generally to electronic circuits, and more particularly, a shared sense amplifier (SA).

Background

With the ever increasing demand for more processing capability in mobile devices, low power consumption has become a common design requirement. Various techniques are currently employed to reduce power consumption in such devices. One such technique involves reducing the operating voltage of certain circuits in the device when certain operating conditions exist. As a result, different circuits may operate at different voltages. For example, memory may store data in one voltage domain, and output the stored data to peripheral circuits in a different voltage domain.

Moreover, minimizing sizes of integrated circuits (ICs) carries substantial advantages, particularly in mobile applications. Accordingly, a design challenge is to address the varying requirements with regard to performance, power, and sizes on ICs.

SUMMARY

Aspects of a sense amplifier (SA) are disclosed. The SA includes a first differential pair of transistors configured to receive a first differential input, a second differential pair of transistors configured to receive a second differential input, and a current source configured to source a current to flow through the first and second differential pairs of transistors.

Aspects of a method of to operate an SA are disclosed. The method includes receiving by a first differential pair of transistors a first differential input, receiving by a second differential pair of transistors a second differential input, and flowing a current through the first and second differential pairs of transistors.

Further aspects of a memory are disclosed. The memory includes a first bank of memory cells, a second bank of memory cells, and an SA. The SA includes a first differential pair of transistors configured to receive a first differential input from the first bank of memory cells, a second differential pair of transistors configured to receive a second differential input from the second bank of memory cells, and a current source configured to source a current to flow through the first and second differential pairs of transistors.

It is understood that other aspects of apparatus and methods will become readily apparent to those skilled in the art from the following detailed description, wherein various aspects of apparatus and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of apparatus and methods will now be presented in the detailed description by way of example, and not by way of limitation, with reference to the accompanying drawings, wherein.

DETAILED DESCRIPTION

Figure 1:
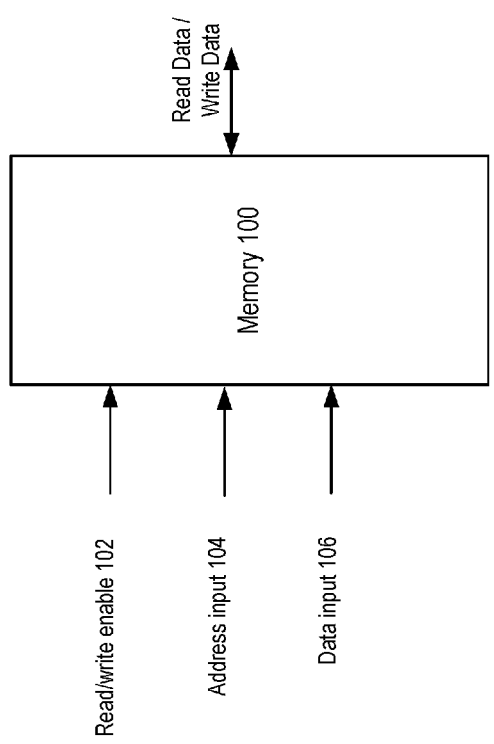
FIG. 1 is a block diagram of an exemplary embodiment of a memory.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

Various memories and methods for writing to memory presented throughout this disclosure may be incorporated within various apparatuses. By way of example, various aspects of memories disclosed herein may be implemented as or in a stand-alone memory. Such aspects may also be included in any integrated circuit (IC) or system, or any portion of an integrated circuit or system (e.g., modules, components, circuits, or the like residing in an integrated circuit or part of an integrated circuit), or any intermediate product where an integrated circuit or system is combined with other integrated circuits or systems (e.g., a video card, a motherboard, etc.) or any end product (e.g., mobile phone, personal digital assistant (PDA), desktop computer, laptop computer, palm-sized computer, tablet computer, work station, game console, media player, computer based simulators, wireless communication attachments for laptops, or the like). Various aspects of methods disclosed herein shall similarly be implemented in a stand-alone memory or included in any integrated circuit or system, or any portion of an integrated circuit or system, or any intermediate product or end product, or any step, process, algorithm, or the like, or any combination thereof performed by such stand-alone memory, integrated circuit or system (or portion thereof), intermediate product, or end product.

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus or method does not require that all embodiments of the invention include the described components, structure, features, functionality, processes, advantages, benefits, or modes of operation.

The terms "connected," "coupled," or any variant thereof, mean any connection or coupling, either direct or indirect, between two or more elements, and can encompass the presence of one or more intermediate elements between two elements that are "connected" or "coupled" together. The coupling or connection between the elements can be physical, logical, or a combination thereof. As used herein, two elements can be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Any reference to an element herein using a designation such as "first," "second," and so forth does not generally limit the quantity or order of those elements. Rather, these designations are used herein as a convenient method of distinguishing between two or more elements or instances of an element. Thus, a reference to first and second elements does not mean that only two elements can be employed, or that the first element must precede the second element.

As used herein, the singular forms "a," "an" and "the" are intended to include the plural forms as well, unless the context clearly indicates otherwise. It will be further understood that the terms "comprises," "comprising," "includes" and/or "including," when used herein, specify the presence of the stated features, integers, steps, operations, elements, and/or components, but do not preclude the presence or addition of one or more other features, integers, steps, operations, elements, components, and/or groups thereof.

Various aspects of a memory will now be presented in the context of a static random access memory (SRAM). SRAM is volatile memory that requires power to retain data. However, as those skilled in the art will readily appreciate, such aspects may be extended to other memories and/or circuit configurations. According all references to an SRAM is intended only to illustrate exemplary aspects of memory with the understanding that such aspects may be extended to a wide range of applications.

FIG. 1 is a block diagram of an exemplary embodiment of a memory. The memory 100 provides a medium for peripheral circuits to write and read data (e.g., program instructions and data operated by the instruction). As used hereinafter, the term "data" will be understood to include program instructions, data, and any other information that may be stored in the memory 100. The memory 100 includes an input for a read/write enable control 102 for controlling the read/write operation of the memory 100. The memory 100 also includes inputs for the address 104 and for write data to be written to the memory 100 at the specified address. The memory further includes an output for read data read from the memory 100 at the specified address. When writing data to the memory 100, a peripheral circuit sets the read/write enable control to the write mode and sends to the memory 100 the address along with the write data to be written to the memory 100 at that address. When reading data from the memory 100, the peripheral circuit sets the read/write enable control to the read mode and sends the address to the memory 100. In response, the memory 100 sends read data at that address to the peripheral circuit.

Figure 2:
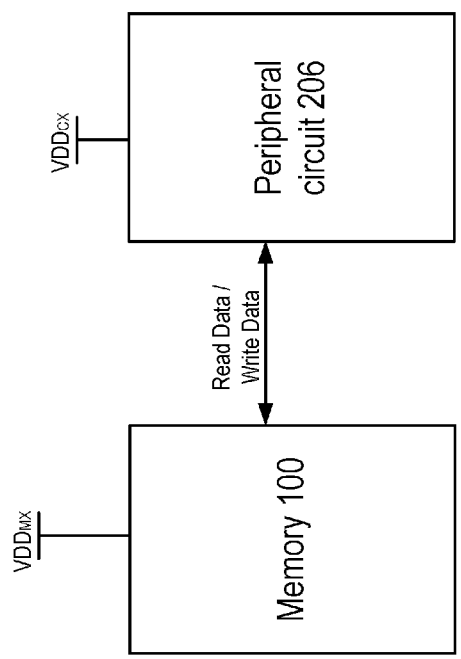
FIG. 2 is a block diagram of an exemplary embodiment of a peripheral circuit supported by a memory.

FIG. 2 is a block diagram 200 of an exemplary embodiment of a peripheral circuit 206 supported by a memory 100. The peripheral circuit 206 and memory 100 may be a system, or part of a larger system, that uses voltage scaling to meet power requirements. This may be achieved by using multiple voltage domains operating at different voltages. In some examples, a voltage domain may be a set or collection of operating voltages that include a voltage supply as the operating voltage and ground. By way of example, the peripheral circuit 206 may be configured to read data from or write data to the memory 100, which has a memory operating voltage $VDD_{MX}$ supplied from a first voltage supply (e.g., operating in the $VDD_{MX}$ voltage domain). The peripheral circuit 206, which operates from a second voltage supply $VDD_{CX}$ (e.g., operating in the $VDD_{CX}$ voltage domain), receives the read data and provides the write data. In some other examples, the memory 100 may also receive power from the second voltage supply $VDD_{CX}$ to interface to the peripheral circuit 206. At different times, the memory operating voltage $VDD_{MX}$ may be higher than or lower than the peripheral operating voltage $VDD_{CX}$ depending on the particular power requirements of the system. The peripheral circuit 206 is to be construed broadly to include any suitable circuit that is peripheral to the memory 100 and capable of accessing the memory 100.

Figure 3:
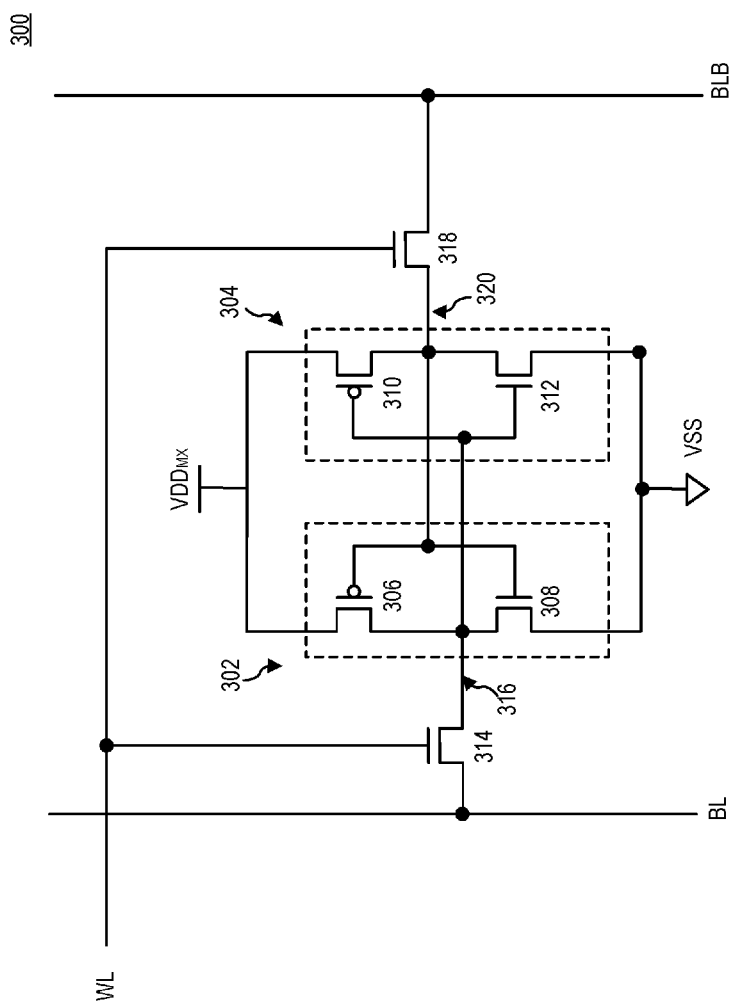
FIG. 3 is a schematic diagram of an exemplary embodiment of a memory cell for an SRAM.

The memory 100 may be any suitable storage medium, such as, by way of example, an SRAM. However, as those skilled in the art will readily appreciate, the memory 100 is not necessarily limited to SRAM. An SRAM includes an array of storage elements know as "cells," "memory cells," or "bitcells." Each memory cell is configured to store one bit of data (e.g., logic 1 or logic 0). FIG. 3 is a schematic diagram of an exemplary embodiment of a memory cell for an SRAM. The memory cell 300 is implemented with a six-transistor (6T) configuration. However, as those skilled in the art will readily appreciate, the cell may be implemented with a four-transistor (4T) or any other suitable transistor configuration.

The memory cell 300 is shown with two inverters 302, 304. The first inverter 302 comprises a p-channel transistor 306 and an n-channel transistor 308. The second inverter 304 comprises a p-channel transistor 310 and an n-channel transistor 312. In the described embodiment, the inverters 302 and 304 are powered by $VDD_{MX}$ and have a return VSS (e.g., ground). The memory cell 300 thus stores data in the $VDD_{MX}$ voltage domain. The first and second inverters 302, 304 are interconnected to form a cross-coupled latch. A first n-channel access transistor 314 couples the output node 316 from the first inverter 302 to a bitline BL, and a second n-channel access transistor 318 couples the output node 320 from the second inverter 304 to a bitline BLB (the value of which is the opposite or inverse of the bitline BL). The gates of the access transistors 314, 318 are coupled to a wordline WL.

A read operation may be initiated by precharging or charging the bitlines BL and BLB to a high level, which is determined so as not to disturb the stored data in the memory cell 300. In other words, the bitlines BL and BLB are precharged to a high level which does not flip the stored data. The wordline WL then is asserted, connecting the cross-coupled inverters 302, 304 to the bitlines BL and BLB via the access transistors 314 and 318, respectively. By way of example, the memory cell 300 may store the logic 1 by storing a low level (e.g., ground) at the output node 316 and a high level (e.g., $VDD_{MX}$) at the output node 320. These states are maintained by the cross-coupled inverters 302, 304. Upon asserting the wordline WL, the inverter 302 discharges the bitline BL through the access transistor 314 and the output node 316. The bitline BLB is maintained at the high level by the inverter 304 through the access transistor 318 and the output node 320. A voltage difference is thus established by the pulling-down of the bitline BL.

The bitlines BL and BLB are fed to a sense amplifier (SA), which sense the data (e.g., voltage difference) carried thereon and outputs a logic level (e.g., logic 1) as the read data to the peripheral circuit 206. The SA will be discussed in details herein.

A write operation may be initiated by setting the bitlines BL and BLB to the value to be written to the memory cell 300 and asserting the wordline WL. That is, the write data are driven onto the bitlines BL and BLB. The wordline WL may be asserted before the value to be written (e.g., write data) is provided to the bitlines BL and BLB. By way of example, a logic 1 may be written to the memory cell 300 by setting the bitline BL to a logic level 0 and the bitline BLB to a logic 1. The logic level 0 at the bitline BL is applied to the input of the second inverter 304 through the access transistor 314, which in turn forces the output node 320 of the second inverter 304 to $VDD_{MX}$. The output node 320 of the second inverter 304 is applied to the input of the first inverter 302, which in turn forces the output node 316 of the first inverter 302 to VSS. A logic level 0 may be written to the memory cell 300 by inverting the values of the bitlines BL and BLB. The write driver (not shown) is designed to be stronger than the pull-up transistors (306 and 310) in the memory cell 300 so that it can override the previous state of the cross-coupled inverters 302, 304.

Once the read or write operation is complete, the wordline is deasserted, thereby causing the access transistors 314 and 318 to disconnect the bitlines BL and BLB from the two inverters 302, 304. The cross-coupling between the two inverters 302, 304 maintains the state of the inverter outputs as long as power is applied to the memory cell 300.

Figure 4:
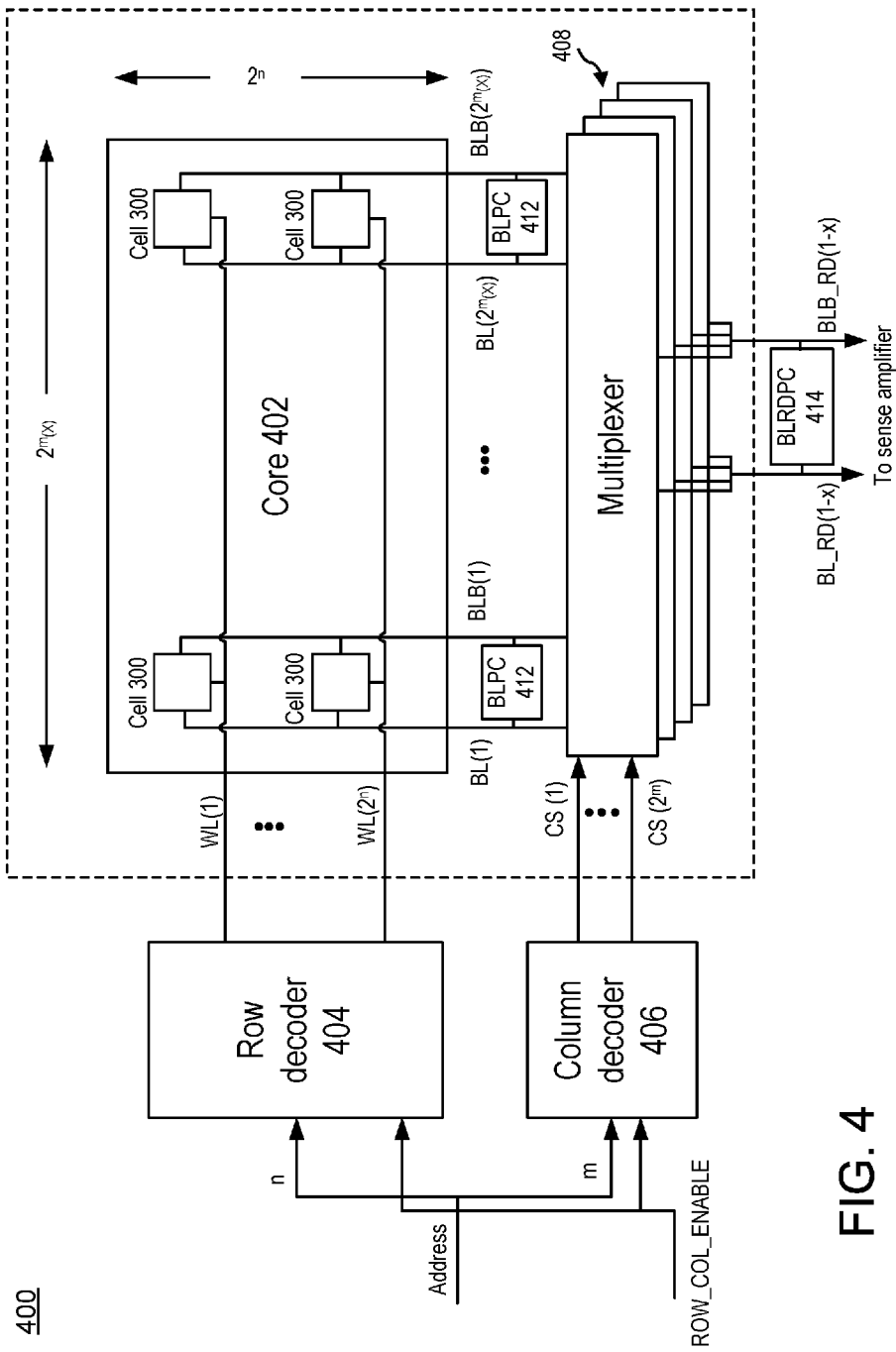
FIG. 4 is a functional block diagram of an exemplary embodiment of an SRAM.

FIG. 4 is a functional block diagram of an exemplary embodiment of an SRAM. Various aspects of an SRAM will now be presented in the context of a read operation. Accordingly, for clarity of presentation, only the connections for the read operation are shown. Those skilled in the art will readily appreciate that additional connections are required to support the write operation.

The SRAM 400 includes a core 402 with supporting circuitry to decode addresses and perform read and write operations. The core 402 is comprised of memory cells 300 arranged to share connections in horizontal rows and vertical columns. Specifically, each horizontal row of memory cells 300 shares a wordline WL and each vertical column of memory cells 300 shares a pair of bitlines BL and BLB. The size of the core 402 (i.e., the number of cells) may vary depending on a variety of factors including the specific application, the speed requirements, the layout and testing requirements, and the overall design constraints imposed on the system. Typically, the core 402 will contain thousands or millions of memory cells.

In the exemplary embodiment of the SRAM shown in FIG. 4, the core 402 is made up of ($2^n \times 2^m(x)$) memory cells 300 arranged in $2^n$ horizontal rows and $2^m(x)$ vertical columns, where $2^m$ is the number of words per row and x is the number of bits outputted for a read access. A peripheral device (not shown) may randomly access any word (i.e., x cells) in the core 402 using an address that is (n+m) bits wide. In this example, n-bits of the address are provided to the input of a row decoder 404 and m-bits of the address are provided to the input of a column decoder 406. The column decoder 406 provides $2^m$ outputs column selects (CS(1)-CS($2^m$)) with a different one of the outputs asserted for each different combination of address inputs. The outputs are provided to x multiplexers 408. By way of example, the multiplexers 408 may include passgates. Each multiplexer may be $2^m$:1 multiplexer and selects one of $2^m$ bitline pairs read from the memory core 402 based on the outputs from the column decoder 406. With x multiplexers 408, x bits are selected and outputted for each read access. In some examples, the multiplexers 408 may be viewed as a $2^m$:1 selector. The selected x bitline pairs are outputted to SAs as bitline pairs BL_RD and BLB_RD.

The row decoder 404 converts the n-bit address into $2^n$ wordline outputs. A different wordline WL is asserted by the row decoder 404 for each different n-bit row address. As a result, each of the $2^m(x)$ memory cells 300 in the horizontal row with the asserted wordline WL is connected to one pair of the $2^m(x)$ bitlines BL and BLB through its access transistors as described above in connection with FIG. 3. The data stored in the memory cells are provide to the BL_RD and BLB_RD bitline pairs through the selected pairs of bitlines BL and BLB and the x multiplexers 408 with the asserted wordline WL, as described with FIG. 3. The BL_RD and BLB_RD bitline pairs are provided to SAs for amplification, and the resulting data of the amplification are outputted as read data.

In some examples, the row decoder 404 and the column decoder 406 may be enabled or disabled by the signal ROW_COL_ENABLE. In a case that the row decoder 404 and the column decoder 406 are disabled by the signal ROW_COL_ENABLE, no WLs and CS may be generated and no access of the memory cells 300 takes place.

Figure 5:
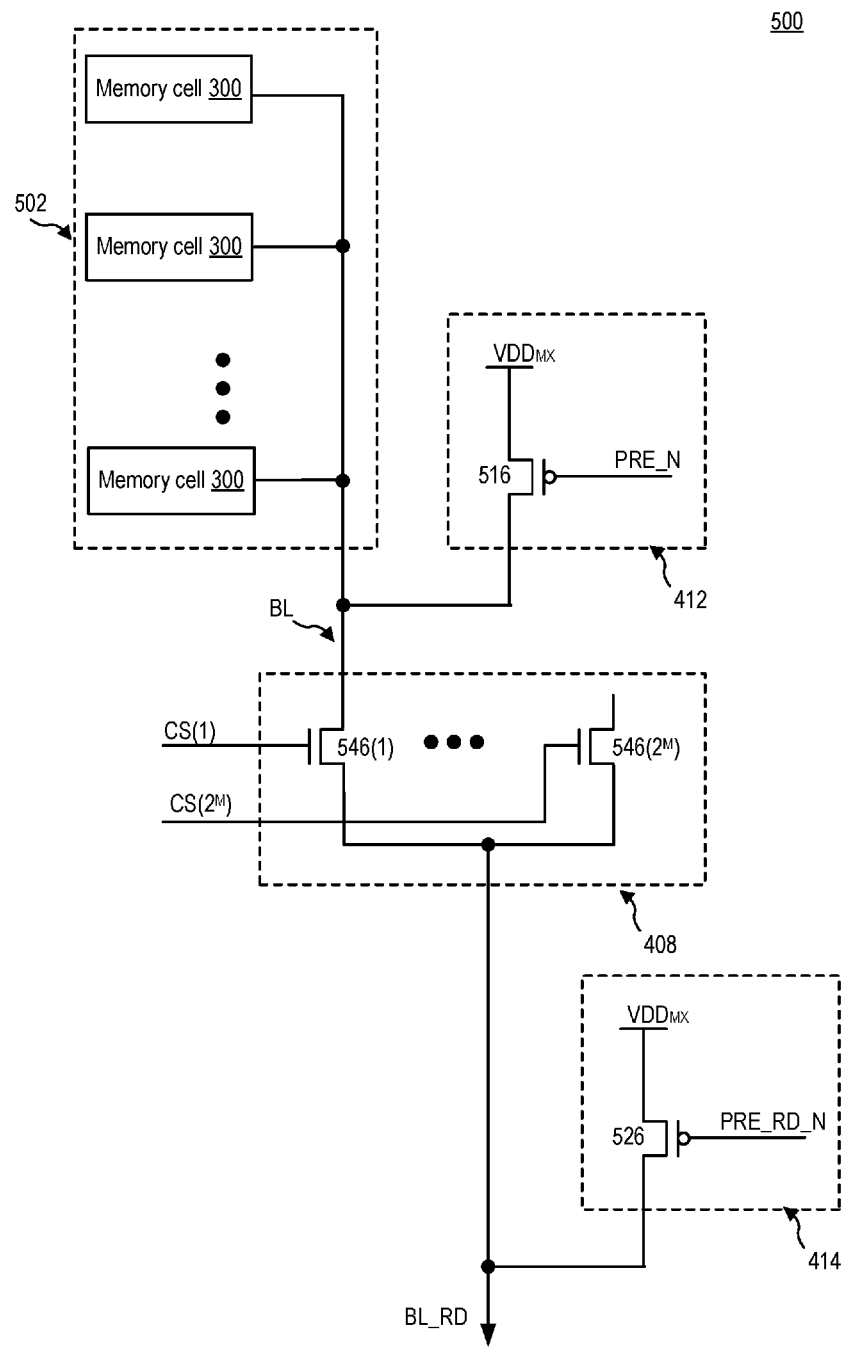
FIG. 5 is a circuit diagram of an exemplary embodiment of a multiplexer and supporting circuitry for one bit of read data of the SRAM of FIG. 4.

FIG. 5 is a circuit diagram of an exemplary embodiment of a multiplexer and supporting circuitry for one bit of read data of the SRAM of FIG. 4. The circuit diagram 500 includes a column 502 of memory cells 300 outputting stored data to the bitline BL. The associated wordline WL and bitline BLB are omitted for clarity. The circuit diagram 500 further includes a precharge circuit 412 that precharges the bitline pair BL and BLB for read operations (as described with FIG. 3), the multiplexer 408 for selecting to the bitline pair BL and BLB to couple to the bitline pair BL_RD and BLB_RD, and a precharge circuit 414 (e.g., charge circuit) that precharges or charges the bitline pair BL_RD and BLB_RD. The bitline BLB_RD is not shown for clarity.

The precharge circuit 412 (e.g., charge circuit) precharges or charges the bitline pair BL and BLB (not shown) to a high state (e.g., $VDD_{MX}$). The high state is set so as not to disturb the data stored in the memory cells 300. The precharge circuit 412 may include a p-channel transistor 516 coupled to the supply voltage $VDD_{MX}$ and the bitline pair BL and BLB. The p-channel transistor 516 is controlled by the signal PRE_N. Prior to the read access, the signal PRE_N activates (e.g., going to a low state) the p-channel transistor 516 to charge the bitline pair BL and BLB to $VDD_{MX}$. In a regular read access, the signal PRE_N may disable the p-channel transistor 516 before the wordline WL is asserted so as to not interfere with the read operation. Upon the assertion of the wordline WL, the data stored in the memory cell may be provided onto the bitline pair BL and BLB. As described with FIG. 3, an example may be pulling-down on the bitline BL (or bitline BLB, depending on the state of the stored data) by the memory cell 300.

The multiplexer 408 selects one of $2^m$ bitline pairs BL and BLB (only one bitline BL is shown) to couple to the selected one to the bitline pair BL_RD and BLB_RD (only bitline BL_RD is shown). The multiplexer 408 may include $2^m$ n-channel transistors 546, each coupled to one of the $2^m$ bitline pairs BL and BLB and the bitline pair BL_RD and BLB_RD. In one example, the bitline BL_RD is pulled down via the selected n-channel transistor 546 by the pulling-down of the bitline BL.

The precharge circuit 414 precharges the bitline pairs BL_RD and BLB_RD (only bitline BL_RD is shown) in similar fashion as the precharge circuit 412 precharging the bitline pair BL and BLB. The precharge circuit 414 may include a p-channel transistor 526 coupled to the voltage supply $VDD_{MX}$ and the bitline pair BL_RD and BLB_RD. The p-channel transistor 516 is controlled by the signal PRE_RD_N. Prior to the read access, the signal PRE_RD_N activates (e.g., going to a low state) the p-channel transistor 526 to charge the bitline pair BL_RD and BLB_RD to $VDD_{MX}$. In a regular read access, the signal PRE_RD_N may disable the p-channel transistor 526 before the wordline WL is asserted so as to not interfere with the read operation. Upon the assertion of the wordline WL, the data stored in the memory cell may be provided from the bitline pair BL and BLB to the bitline pair BL_RD and BLB_RD. As described with FIG. 3, an example may be pulling-down on the bitline BL_RD (or bitline BLB_RD, depending on the state of the stored data) by the memory cell 300 via the bitline BL and the multiplexer 408. The bitline pair BL_RD and BLB_RD is provided to a SA to amplify the data thereon (e.g., amplify the pulling-down of the bitlines BL_RD or BLB_RD). The bitline pair BL_RD and BLB_RD may be outputted to the SA via various schemes beyond the one illustrated in FIG. 5. In some examples, the bitline pair BL_RD and BLB_RD may be outputted via active drivers after the multiplexer 408 stage. In some examples, the data on the bitline pair BL_RD and BLB_RD correspond to the data stored in the selected memory cell or cells 300.

Figure 6:
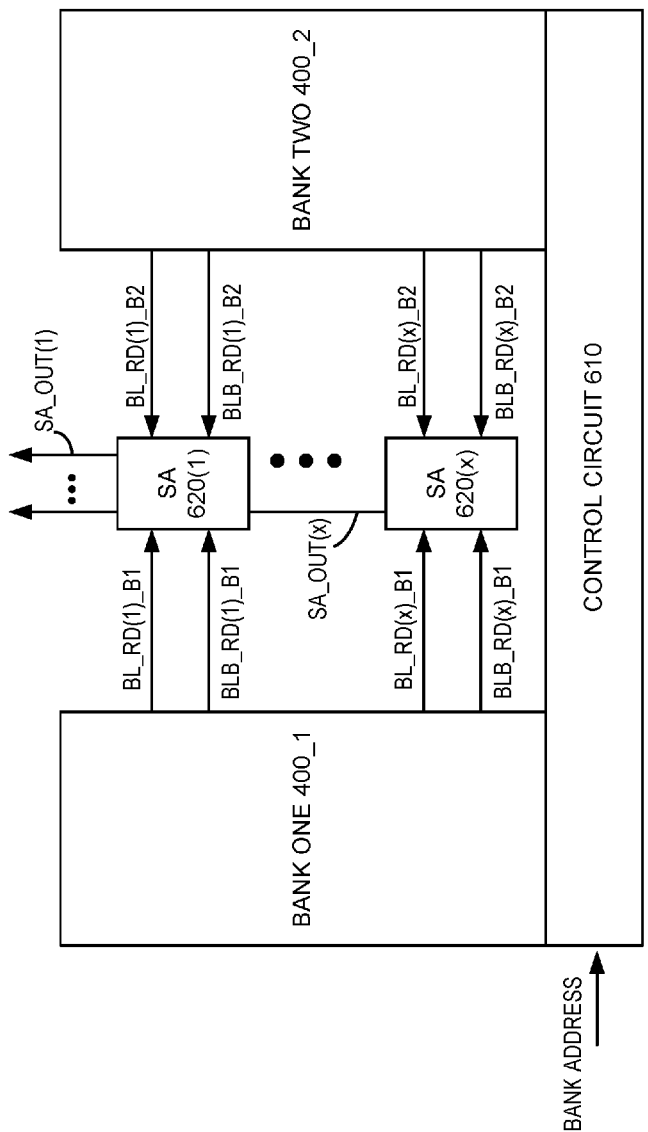
FIG. 6 is an architecture diagram of an exemplary embodiment of a multi-bank memory incorporating the SRAM of FIG. 4.

FIG. 6 is an architecture diagram of an exemplary embodiment of a multi-bank memory incorporating the SRAM of FIG. 4. The multi-bank memory 600 includes a first bank (400_1) and a second bank (400_2) of the SRAM 400 of FIG. 4. A bank of memory, for example, may be a block of memory cells. Each of the banks (400_1 and 400_2) may include the row decoder 404 and the column decoder 406. In term of addressing, the banks 400_1 and 400_2 are addressed by the BANK_ADDRESS. The banks 400_1 and 400_2 share SAs 620 (e.g., 620(1)-620(x)). The control circuit 610 operates bank selection and read/write access of the banks.

For example, the selection of the banks 400_1 and 400_2 is addressed by the BANK_ADDRESS. When the BANK_ADDRESS is low, for example, the control circuit 610 may select the bank 400_1 by activating the ROW_COL_ENABLE signal in the bank 400_1 and deactivating the corresponding signal in the bank 400_2.

In a read operation, the control circuit 610 may further control the precharge circuits 412 and 414 by controlling the PRE_N and the PRE_RD_N signals, respectively. For example, for the unselected bank 400_2, the control circuit 610 may keep both the PRE_N and the PRE_RD_N signals of the bank 400_2 activated. The bitline pair BL_RD and BLB_RD of the bank 400_2 (labeled BL_RD_B2 and BLB_RD_B2) would thus remain at high level (e.g., $VDD_{MX}$) during a read access of the bank 400_1.

As described with FIGS. 3-5, the data stored in the selected memory cell 300 may be placed onto the bitline pair BL_RD and BLB_RD. In some examples, the stored data may be indicated by the pull-down of the bitline BL_RD (or the bitline BLB_RD as dictated by the state of the stored data).

The SAs 620 are shared by the banks 400_1 and 400_2. The outputted bitline pairs BL_RD and BLB_RD from both banks (labeled BL_RD_B1 and BLB_RD_B1 for the first bank 400_1, and labeled BL_RD_B2 and BLB_RD_B2 for the second bank 400_2) are provided to the SAs 620. In some examples, the SA 620 receives the bitline pairs BL_RD and BLB_RD from both banks directly (e.g., without being through a multiplexor selecting the bitline pair BL_RD and BLB_RD from one of the banks 400_1 and 400_2, for example). In some examples, the SA 620s operate in the $VDD_{CX}$ voltage domain, while the received bitline pairs BL_RD and BLB_RD are in the $VDD_{MX}$ voltage domain. As presented below, the SA 620s output SA_OUTs in the $VDD_{CX}$ voltage domain without using a level-shifter. In other words, the SAs 620 may incorporate within the level-shifting function.

Figure 7:
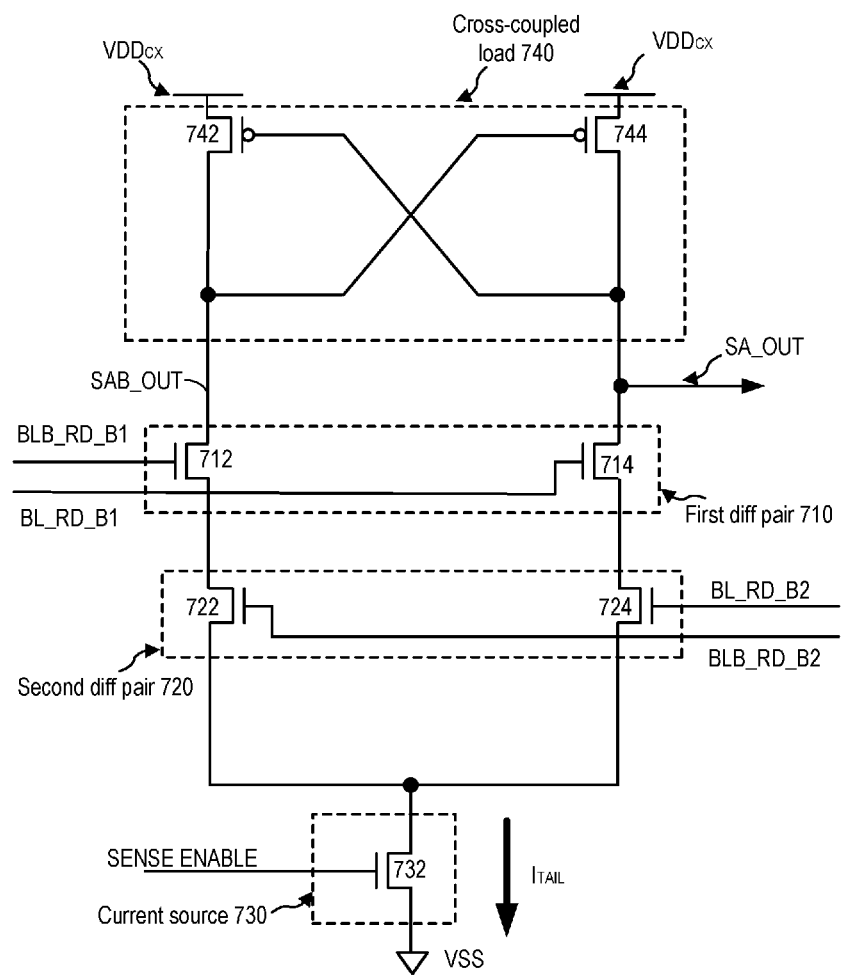
FIG. 7 is a circuit diagram of an exemplary embodiment of the sense amplifier shared by the multiple banks of FIG. 4.

FIG. 7 is a circuit diagram of an exemplary embodiment of the sense amplifier shared by the multiple banks of FIG. 4. The shared SA 620 includes a first differential pair of transistors 710, the second differential pair of transistors 720, a current source 730, and a cross coupled load 740.

The first differential pair of transistors 710 may be configured to receive the bitline pair BL_RD_B1 and BLB_RD_B1 from the first bank 400_1 as a differential input. For example, the first differential pair of transistors 710 may include n-channel transistors 712 and 714 configured as a differential pair. The gate of the n-channel transistor 712 receives the BLB_RD_B1 as an input, and the gate of the n-channel transistor 714 receives the BL_RD_B1 as an input.

The second differential pair of transistors 720 may be configured to receive the bitline pair BL_RD_B2 and BLB_RD_B2 from the second bank 400_2 as a differential input. For example, the second differential pair of transistors 720 may include n-channel transistors 722 and 724 configured as a differential pair. The gate of the n-channel transistor 722 receives the BLB_RD_B2 as an input, and the gate of the n-channel transistor 724 receives the BL_RD_B2 as an input.

In some examples, the first and the second differential pair of transistors 710 and 720 are arranged in a stack. For example, the n-channel transistor 712 of the first differential pair of transistors 710 and the n-channel transistor 722 of the second differential pair of transistors 720 are arranged in series, and a same current flows through both transistors. The n-channel transistor 714 of the first differential pair of transistors 710 and the n-channel transistor 724 of the second differential pair of transistors 720 are arranged in series, and a same current flows through both transistors. In some configurations, the first differential pair of transistors 710 is coupled to the cross-coupled load 740 (via the nodes SA_OUT and SAB_OUT) and the second differential pair of transistors 720. The second differential pair of transistors 720 is further coupled to the current source 730.

The current source 730 provides a tail current $I_{TAIL}$ that flows through both the first differential pair of transistors 710 and the second differential pair of transistors 720. The current source 730 may include an n-channel transistor 732 coupled to ground and to the second differential pair of transistors 720. The gate of the n-channel transistor 732 may received a reference signal SENSE_ENABLE to generate the desired tail current $I_{TAIL}$. The activation of the reference signal SENSE_ENABLE activates the SA 620 to amplify the received differential input. In some examples, the control circuit 610 may control the activation of the reference signal SENSE_ENABLE.

The cross-coupled load 740 couples to the supply voltage $VDD_{CX}$ and the first differential pair of transistors 710 (via the nodes SA_OUT and SAB_OUT). The cross-coupled load 740 may include cross-coupled p-channel transistors 742 and 744. The gate of the p-channel transistor 742 may be coupled to the drain of the p-channel transistor 744 and the node SA_OUT. The gate of the p-channel transistor 744 may be coupled to the drain of the p-channel transistor 742 and the node SAB_OUT. The output of the SA 620 may be the node SA_OUT.

The SA 620 may include other circuits not shown for clarity. For example, the SA 620 may include a SA precharge circuit (not shown) that precharges the nodes SA_OUT and SAB_OUT to a high level (e.g., $VDD_{CX}$). The SA precharge circuit may operate at an opposite phase as the current source 730. For example, as the signal SENSE_ENABLE turns on the current source 730, the SA precharge circuit may be turned OFF to allow the SA 620 to amplify the received differential input.

The SA 620 may further include weak pull-up circuit (not shown) coupled to the nodes SA_OUT and SAB_OUT. In some examples, the pull-up circuit may be weak and constantly on to minimize jitters on the nodes SA_OUT and SAB_OUT arising from, for example, noise coupling. The pull-up circuit may be very weak (e.g., long channel transistors) so as not to interfere with the sensing performed by the SA 620.

As described above, the SA 620 is shared by the bank 400_1 and the bank 400_2 and receives the input differential signals (e.g., the bitline pairs BL_RD and BLB_RD) from both banks of memory directly. In other words, the input differential signals are not passed through a bank-select multiplexer when provided to the SA 620. Moreover, the SA 620 receives the differential inputs (e.g., bitline pair BL_RD and BLB_RD) in the $VDD_{MX}$ voltage domain, and outputs the SA_OUT at the $VDD_{CX}$ domain. Thus, the level-shifting function is incorporated and performed by the SA 620. Since no additional bank-select multiplexer and level-shifter circuit are required, area and power saving may be achieved by the SA 620 with minimum impact on performance.

Figure 8:
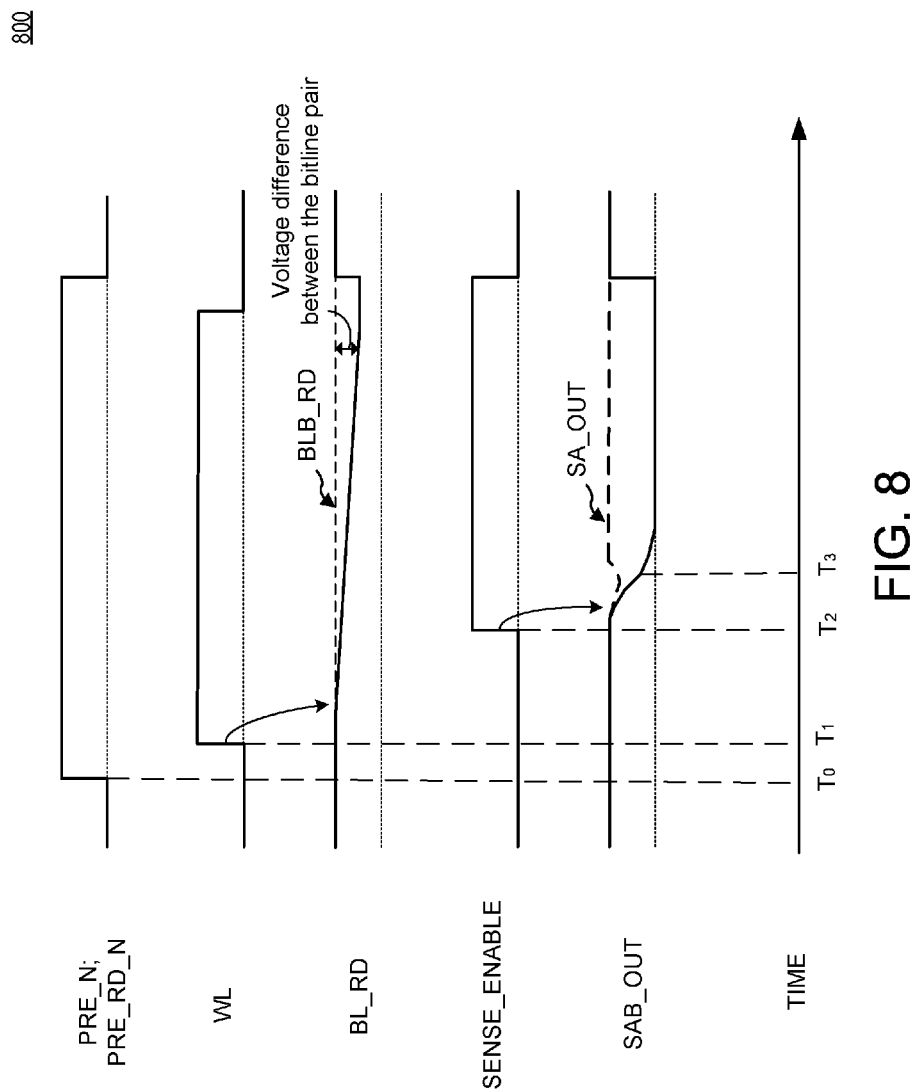
FIG. 8 is a timing diagram of a read operation of the sense amplifier of FIG. 7

A read operation of the SA 620 is presented with the timing diagram of FIG. 8. FIG. 8 is a timing diagram of a read operation of the sense amplifier of FIG. 7. The read operation will be described with reference to FIGS. 3-6. In this example, the memory cell 300 stores a logic 1 at the output of the inverter 302, and stores a logic 0 at the output of the inverter 304. Further, the bank 400_1 is selected (and the bank 400_2 is not selected). Accordingly, unless specified, the circuits and signals referenced herein refer those of the bank 400_1. At $T_0$, the control circuit 610 asserts the signals PRE_N and PRE_RD_N (e.g., pull to a high level) to respectively disable the precharge circuit 412 precharging the bitline pairs BL and BLB to $VDD_{MX}$ and to disable the precharge circuit 414 precharging the bitline pair BL_RD and BLB_RD to $VDD_{MX}$.

The PRE_N and PRE_RD_N of the bank 400_2 may remain low to keep the precharge circuit 412 precharging the bitline pairs BL and BLB to $VDD_{MX}$ and to keep the precharge circuit 414 precharging the bitline pair BL_RD and BLB_RD to $VDD_{MX}$ of the bank 400_2.

At $T_1$, the control circuit 610 asserts the ROW_COL_ENABLE signal (e.g., pulling to the high level), leading to the assertion of the wordline WL (e.g., driven to $VDD_{MX}$). The activation connects the bitline pair BL and BLB to the memory cell 300. Specifically, the bitline BL is connected to the output of the inverter 302 through the access transistor 314, and the bitline BLB is connected to the output of the inverter 304 through the access transistor 318. The bitline BL, which was pre-charged before the read operation, begins discharging through the n-channel transistor 308 in the inverter 302 toward VSS (i.e., a logic level 0). The bitline BLB remains charged (i.e., logic 1). See the description provided with FIG. 3. As a result, a voltage difference is developed between the bitline BL and the bitline BLB and between the bitline BL_RD and the bitline BLB_RD.

The ROW_COL_ENABLE signal of the bank 400_2 may remain deactivated, so no wordlines WLs are activated. Accordingly, the bitlines BL and BLB are not connected to the memory cell 300, and the bitline pair BL and BLB and the bitline pair BL_RD and BLB_RD remain charged in the bank 400_2.

At $T_2$, the control circuit 610 asserts the SENSE_ENABLE signal (e.g., pulling to a high level) to enable the SA 620. In response, the current source generates the tail current $I_{TAIL}$ that flows through the first differential pair of transistors 710 and the second differential pair of transistors 720. As described above, the differential input received by the second differential pair of transistors 720 (the bitline pair BL_RD and BLB_RD from the bank 400_2) remains high at $VDD_{MX}$, and accordingly, the second differential pair of transistors 720 provides a low-resistance conductive path for the first differential pair of transistors 710.

The first differential pair of transistors 710, in response to the voltage difference on the received differential input (the bitline pair BL_RD and BLB_RD from the bank 400_1) and the tail current $I_{TAIL}$, starts to pull down the node SA_OUT and the node SAB_OUT at different rates. For example, as the bitline BL_RD is pulled low and the bitline BLB_RD remains high at $VDD_{MX}$, the n-channel transistor 712 receiving the bitline BLB_RD would be turned ON stronger than the n-channel transistor 714 receiving the bitline BL_RD. In other words, most of the tail current $I_{TAIL}$ would flow through the n-channel transistor 712, and the node SAB_OUT would be pulled down faster than the node SA_OUT.

At $T_3$, the voltage difference between the node SA_OUT and the node SAB_OUT is sufficient to activate the cross-coupled load 740. For example, the node SAB_OUT may be low enough to turn ON the p-channel transistor 744, which helps to pull-up the node SA_OUT. As a result, the nodes SA_OUT and SAB_OUT may be pulled to (nearly) rail-to-rail levels. At this stage, the node SA_OUT, for example, may be outputted and stored at a subsequent stage.

As described above, the first differential pair of transistors 710 is configured to amplify the first differential input (the bitline pair BL_RD and BLB_RD of bank 400_1) when the second differential pair of transistors 720 is in a conductive state (e.g., both the n-channel transistors 722 and 724 are in the ON state) (e.g., at $T_2$). The second differential pair of transistors 720 receives the second different input, the bitline pair BL_RD and BLB_RD of bank 400_2. The bitlines BL_RD and BLB_RD of bank 400_2 are both powered (e.g., charged) by the supply voltage level $VDD_{MX}$ of the $VDD_{MX}$ voltage domain.

Figure 9:
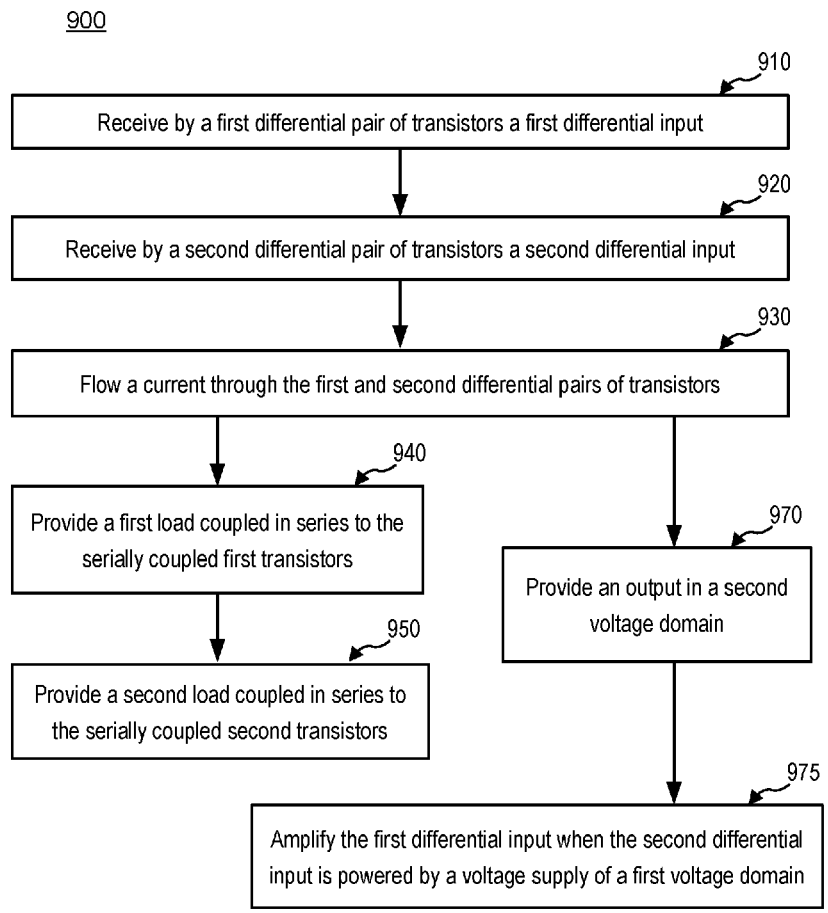
FIG. 9 is the flowchart illustrating a read operation of an exemplary embodiment of a sense amplifier.

FIG. 9 is the flowchart illustrating a read operation of an exemplary embodiment of a sense amplifier. The operations may be performed by the memory 600 and/or the SA 620. At 910, a first differential input is received by a first differential pair of transistors 710. See FIG. 7 for example. The first differential pair of transistors 710 receives a first differential input including the bitline pair BL_RD and BLB_RD from the bank 400_1. The first differential pair of transistors may include a first n-channel transistor 712 and a second n-channel transistor 714. At 920, a second differential input is received by a second differential pair of transistors. See FIG.

7 for example. The second differential pair of transistors 720 receives a second differential input including the bitline pair BL_RD and BLB_RD from the bank 400_2. The second differential pair of transistors may include a first n-channel transistor 722 and a second n-channel transistor 724. In some examples, the first and second differential inputs are from a first voltage domain (e.g., the $VDD_{MX}$ voltage domain).

At 930, a current is flowed through the first and second differential pairs of transistors. See FIG. 7 for example. The current source 730 may be enabled by the reference signal SENSE_ENABLE to generate a tail current $I_{TAIL}$, which flows through the first differential pair of transistors 710 and the second differential pair of transistors 720.

At 940, a first load is provided coupled in series to the serially coupled first transistors. See FIG. 7 for example. A cross-coupled load 740 includes a first load of a p-channel transistor 742, which is coupled in series to the serially coupled first transistor 712 of the first differential pair of transistors 710 and first transistor 722 of the second differential pair of transistors 720. At 950, a second load is provided coupled in series to the serially coupled second transistors. See FIG. 7 for example. The cross-coupled load 740 includes a second load of a p-channel transistor 744, which is coupled in series to the serially coupled second transistor 714 of the first differential pair of transistors 710 and second transistor 724 of the second differential pair of transistors 720.

At 970, an output is provided in a second voltage domain. See FIG. 7 for example. The output node SA_OUT is coupled to and pulled up, in one state, by the supply voltage $VDD_{CX}$. At 975, one of the differential inputs is amplified when another one of the differential inputs is powered by a voltage supply of a first voltage domain. See FIG. 7 for example. The bank 400_1 is selected, and the bank 400_2 is not. In some example, the first differential input (including the bitline pair BL_RD and BLB_RD from the bank 400_1) is amplified by the first differential pair of transistors 710 and/or the cross-coupled load 740. In parallel, since the bank 400_2 is not selected, the second differential input (including the bitline pair BL_RD and BLB_RD from the bank 400_2) is powered by the voltage supply $VDD_{MX}$ of the $VDD_{MX}$ voltage domain.

Figure 10:
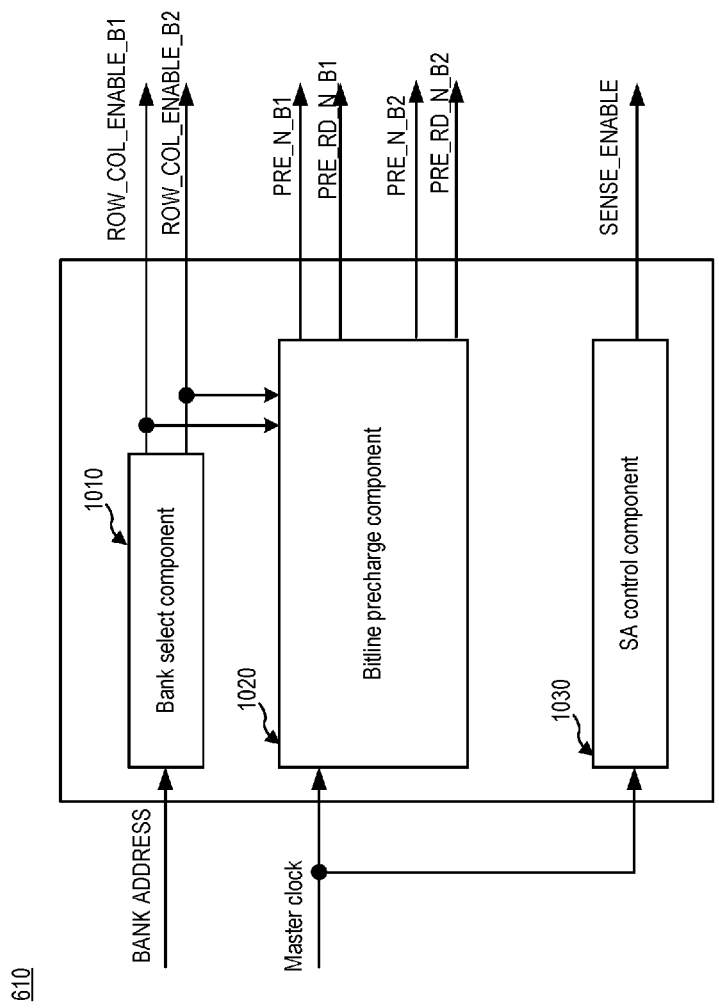
FIG. 10 is a block diagram of an exemplary embodiment of a control circuit of FIG. 6.

FIG. 10 is a block diagram of an exemplary embodiment of a control circuit of FIG. 6. In an exemplary embodiment, the control circuit 610 and the components contained therein, presented below, may include circuits, processor or processors, software executing on the processor or processors, or combinations thereof. These components may include circuits for generating the signals for the functions described infra or signal lines carrying those signals.

By way of example, a component, or any portion of a component, or any combination of components may be implemented with one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

The control circuit 610 includes a bank select component 1010, a bitline precharge component 1020, and a SA control component 1030. The bank select component 1010 receives the BANK_ADDRESS and generates the ROW_COL_ENABLE_B1 and the ROW_COL_ENABLE_B2 signals, which are provided to the row decoder 404 and the column decoder 406 of the bank 400_1 and the bank 400_2, respectively. For example, the bank 400_1 may be selected, and the ROW_COL_ENABLE_B1 signal is asserted. The row decoder 404 and the column decoder 406 of the bank 400_1 are enabled to generate the wordline WL and the column selects CS, respectively. The ROW_COL_ENABLE_B2 signal is not activated, as the bank 400_2 is not selected. The row decoder 404 and the column decoder 406 of the bank 400_2 are not enabled, and no wordlines WLs and the column selects CS are generated in the bank 400_2.

The bitline precharge component 1020 may receive a master clock for timing. The bitline precharge component 1020 may generate the precharge signals PRE_N and PRE_RD_N for the selected bank, based on the ROW_COL_ENABLE_B1 and the ROW_COL_ENABLE_B2 signals. For example, the bank 400_1 is selected, and in response, the bitline precharge component 1020 deactivates the precharge signals PRE_N and PRE_RD_N to stop the precharging or charging of the bitline pair BL and BLB and the bitline pair BL_RD and BLB_RD, respectively, for the reading access of the bank 400_1. In the unselected bank 400_2, the precharge signals PRE_N and PRE_RD_N remain activated to precharge or charge the bitline pair BL and BLB and the bitline pair BL_RD and BLB_RD, respectively, to the voltage supply $VDD_{MX}$.

The SA control component 1030 may also receive the master clock for timing. Referring to FIG. 8, at $T_2$, the SA control component 1030 activates the reference signal SENSE_ENABLE to amplify the data (e.g., the voltage difference) on the bitline pair BL_RD and BLB_RD.

The specific order or hierarchy of blocks in the method of operation described above is provided merely as an example. Based upon design preferences, the specific order or hierarchy of blocks in the method of operation may be re-arranged, amended, and/or modified. The accompanying method claims include various limitations related to a method of operation, but the recited limitations are not meant to be limited in any way by the specific order or hierarchy unless expressly stated in the claims.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112(f) unless the element is expressly recited using the phrase "means for" or, in the case of a method claim, the element is recited using the phrase "step for."

What is claimed is:

1. A sense amplifier, comprising
a first differential pair of transistors configured to receive a first differential input from a first memory bank;
a second differential pair of transistors configured to receive a second differential input from a second memory bank that is different from the first memory bank; and
a current source configured to source a current to flow through the first and second differential pairs of transistors.

2. The sense amplifier of claim 1, wherein the first and second differential pairs of transistors are further configured to receive the first and second differential inputs, respectively, from a first voltage domain.

3. The sense amplifier of claim 2, wherein the first and second differential pairs of transistors are further configured to provide an output in a second voltage domain.

4. The sense amplifier of claim 3, wherein one of the first and second differential pairs of transistors is configured to amplify a received differential input when another one of the first and second differential pairs of transistors is powered by a voltage supply of the first voltage domain.

5. The sense amplifier of claim 1, wherein the first and second differential pairs of transistors each comprises first and second transistors, the first transistors being coupled in series to the current source and the second transistors being coupled in series to the current source.

6. The sense amplifier of claim 5, further comprising a first load coupled in series to the serially coupled first transistors and a second load coupled in series to the serially coupled second transistors.

7. The sense amplifier of claim 6, wherein the first and second loads are cross-coupled.

8. The sense amplifier of claim 1, wherein the first differential pair of transistors is configured to receive the first differential input from the first memory bank at inputs of the first differential pair of transistors, and the second differential pair of transistors is configured to receive the second differential input from the second memory bank at inputs of the second differential pair of transistors.

9. The sense amplifier of claim 1, wherein the first and second differential pairs of transistors are arranged as a stack.

10. The sense amplifier of claim 1, wherein one of the differential pairs of transistors is configured to amplify a received differential input when another one of the differential pairs of transistors is in a conductive state.

11. A method for operating a sense amplifier, comprising
receiving by a first differential pair of transistors a first differential input from a first memory bank;
receiving by a second differential pair of transistors a second differential input from a second memory bank that is different from the first memory bank; and
flowing a current through the first and second differential pairs of transistors.

12. The method of claim 11, wherein the first and second differential inputs are from a first voltage domain.

13. The method of claim 12, further comprising providing an output in a second voltage domain.

14. The method of claim 13, further comprising amplifying one of the differential inputs when another one of the differential inputs is powered by a voltage supply of the first voltage domain.

15. The method of claim 11, wherein the first and second differential pairs of transistors each comprises first and second transistors, the first transistors being coupled in series and the second transistors being coupled in series.

16. The method of claim 15, further comprising providing a first load coupled in series to the serially coupled first transistors and providing a second load coupled in series to the serially coupled second transistors.

17. The method claim 16, wherein the first and second loads are cross-coupled.

18. The method of claim 11, wherein the first differential input is received from a first memory bank at inputs of the first differential pair of transistors, and the second differential input is received from a second memory bank at inputs of the second differential pair of transistors.

19. The method of claim 11, wherein the first and second differential pairs of transistors are arranged as a stack.

20. A memory comprising:
a first bank of memory cells and a second bank of memory cells, the first bank of memory cells being different from the second bank of memory cells; and
a sense amplifier, comprising
a first differential pair of transistors configured to receive a first differential input from the first bank of memory cells;
a second differential pair of transistors configured to receive a second differential input from the second bank of memory cells; and
a current source configured to source a current to flow through the first and second differential pairs of transistors.

21. The memory of claim 20, wherein the first and second differential pairs of transistors are further configured to receive the first and second differential inputs, respectively, from a first voltage domain.

22. The memory of claim 21, wherein the first and second differential pairs of transistors are further configured to provide an output in a second voltage domain.

23. The memory of claim 22, further comprising a first charge circuit and a second charge circuit configured to respectively charge the first differential input and the second differential input to a supply voltage of the first voltage domain.

24. The memory of claim 23, wherein one of the first charge circuit and the second charge circuit is configured to stop charging a corresponding differential input to provide data onto the corresponding differential input for amplification, when another one of the first charge circuit and the second charge circuit charges the other corresponding differential input.

25. The memory of claim 20, wherein the first and second differential pairs of transistors each comprises first and second transistors, the first transistors being coupled in series to the current source and the second transistors being coupled in series to the current source.

26. The memory of claim 25, further comprising a first load coupled in series to the serially coupled first transistors and a second load coupled in series to the serially coupled second transistors.

27. The memory of claim 26, wherein the first and second loads are cross-coupled.

28. The memory of claim 20, wherein the first and second differential pairs of transistors are arranged as a stack.

* * * * *